United States Patent
Böhler et al.

(10) Patent No.: US 10,914,791 B2
(45) Date of Patent: *Feb. 9, 2021

(54) TEST SYSTEM FOR TESTING ELECTRICAL CONNECTIONS BETWEEN COMPONENTS AND A PRINTED CIRCUIT BOARD

(71) Applicant: Endress+Hauser Flowtec AG, Reinach (CH)

(72) Inventors: Thomas Böhler, Kandern (DE); Matthias Brudermann, Moehlin (CH); Christoph Werle, Liestal (CH); Markus Wucher, Lörrach (DE); Daniel Kollmer, Maulburg (DE); Ludovic Adam, Chalampé (FR)

(73) Assignee: Endress+Hauser Flowtec AG, Reinach (CH)

( * ) Notice: Subject to any disclaimer, the term of this patent is extended or adjusted under 35 U.S.C. 154(b) by 69 days.

This patent is subject to a terminal disclaimer.

(21) Appl. No.: 16/321,925

(22) PCT Filed: Jul. 14, 2017

(86) PCT No.: PCT/EP2017/067810
§ 371 (c)(1),
(2) Date: May 7, 2019

(87) PCT Pub. No.: WO2018/024463
PCT Pub. Date: Feb. 8, 2018

(65) Prior Publication Data
US 2019/0277903 A1    Sep. 12, 2019

(30) Foreign Application Priority Data
Aug. 1, 2016 (DE) .................. 10 2016 114 144

(51) Int. Cl.
*G01R 31/04* (2006.01)
*G01R 31/70* (2020.01)
*G01R 31/28* (2006.01)

(52) U.S. Cl.
CPC .......... *G01R 31/70* (2020.01); *G01R 31/2818* (2013.01)

(58) Field of Classification Search
CPC .... H05K 3/30; H05K 13/0465; H05K 1/0268; H05K 13/083; H05K 1/025;
(Continued)

(56) References Cited

U.S. PATENT DOCUMENTS 5,469,064 A * 11/1995 Kerschner ............... G01R 1/07
324/537
5,625,292 A *  4/1997 Crook ................... G01R 31/70
324/538

(Continued)

FOREIGN PATENT DOCUMENTS

CN        1251425 A    4/2000
CN      103492864 A    1/2014
(Continued)

OTHER PUBLICATIONS

International Search Report for Patent Application No. PCT/EP2017/067810, WIPO, dated Sep. 19, 2017, 12 pp.
(Continued)

*Primary Examiner* — Vinh P Nguyen
(74) *Attorney, Agent, or Firm* — Mark A. Logan; Endress+Hauser (USA) Holding Inc.

(57) ABSTRACT

A test system for testing electrical connections, especially soldered connections, between electronic components and a circuit board to be tested, characterized in that the test system has a communication interface, which by contacting the circuit board enables a data exchange with a data
(Continued)

memory or a communication module of the circuit board to be tested, wherein the communication interface is arranged within a housing of the test system freely movably in at least two spatial directions, preferably three spatial directions.

19 Claims, 8 Drawing Sheets

(58) Field of Classification Search
CPC ...... H05K 1/0269; H05K 1/144; H05K 1/189; H05K 2201/10098; H05K 2203/1545; H05K 3/1233; H05K 3/225; H05K 2203/162; H05K 3/306; H05K 3/34; H05K 3/3468; H05K 5/0069; G06F 1/1658; G06F 1/1684; G06F 1/187; G06F 30/39; G06F 30/398; G01R 31/2818; G01R 31/2808; G01R 31/71; G01R 1/06705; G01R 1/07364; G01R 31/287; G01R 31/2886; G01R 31/2887; G01R 31/2893; G01R 31/3004; G01R 31/396; G01R 31/58; G01R 31/68; G01R 31/70; G01R 31/2806; G01R 31/281; G01R 31/2812; G01R 31/2896; G01R 31/31701; G01R 31/31704; G01R 31/31713; G01R 31/31723; G01R 31/318544; G01R 31/31907; G01R 31/31928; H01R 12/716; H01R 13/6582; H01R 12/52; H01R 12/7082; H01R 12/721; H01R 12/722; H01R 12/73; H01R 13/514; H01R 4/025; H01R 13/6275; H01R 13/6594; H01R 43/0242; H01R 43/0263; H01R 4/723; G05B 19/4184; G05B 19/41875; G05B 2219/32194; G05B 2219/42155; H04B 17/21; G01B 11/08; G01B 11/25; G07F 7/0873

See application file for complete search history.

(56) References Cited

U.S. PATENT DOCUMENTS

| | | | |
|---|---|---|---|
| 5,764,071 A * | 6/1998 | Chan | G01R 1/0408 324/756.02 |
| 6,259,265 B1 | 7/2001 | Han et al. | |
| 6,427,216 B1 | 7/2002 | El-Kik et al. | |
| 6,564,986 B1 * | 5/2003 | Hsieh | G01R 31/2812 228/103 |
| 6,891,388 B2 * | 5/2005 | Huggins | G01R 31/2806 324/750.15 |
| 2004/0064285 A1 | 4/2004 | Repko et al. | |
| 2004/0257090 A1 | 12/2004 | Barr et al. | |
| 2005/0237073 A1 | 10/2005 | Miller et al. | |
| 2013/0018624 A1 * | 1/2013 | Bhatnagar | G01R 31/58 702/119 |
| 2014/0062521 A1 | 3/2014 | Yamada | |
| 2014/0263613 A1 | 9/2014 | Roisen et al. | |
| 2015/0168452 A1 | 6/2015 | Chang | |
| 2019/0235015 A1 * | 8/2019 | Bohler | G01R 31/2818 |

FOREIGN PATENT DOCUMENTS

| | | |
|---|---|---|
| DE | 102004063488 A1 | 12/2006 |
| DE | 102010053766 A1 | 6/2012 |
| TW | 201525485 A | 7/2015 |

OTHER PUBLICATIONS

Search Report for German Patent Application No. 10 2016 114 144.5, German Patent Office, dated Apr. 28, 2017, 7 pp.

* cited by examiner

TEST SYSTEM FOR TESTING ELECTRICAL CONNECTIONS BETWEEN COMPONENTS AND A PRINTED CIRCUIT BOARD

CROSS-REFERENCE TO RELATED APPLICATIONS

The present application is related to and claims the priority benefit of German Patent Application No. 10 2016 114 144.5, filed on Aug. 1, 2016 and International Patent Application No. PCT/EP2017/067810 filed on Jul. 14, 2017, the entire contents of which are incorporated herein by reference.

TECHNICAL FIELD

The present invention relates to a test system for testing electrical connections, especially soldered connections, between electronic components and a circuit board to be tested.

BACKGROUND

EP 0 633 478 A2 discloses such a test system for testing electrical connections of electronic components with a circuit board.

Such test systems have been successively further developed. Thus, the test tips are guidable by movable spindles and/or robot arms to the circuit board to be tested and ascertain, e.g. by resistance measurement, whether a soldered connection is correctly positioned and whether an electrical connection of the electronic components of the circuit board has succeeded via such soldered connection.

Increasingly, circuit boards are equipped with communication modules, e.g. USB or Ethernet plug connections, in order to enable data transmission between other circuit boards or external electronic devices and the electronic components of the circuit boards, especially with one or more data memories located on the circuit board.

For this, test systems currently applied in such circumstances have no capability for an automated function testing.

Starting from the state of the art, it is an object of the present invention to enable a functional testing of the data paths of the circuit board to be tested by an aforementioned test system.

The present invention achieves this object by a test system as defined in claim 1.

The test system for testing electrical connections, especially soldered connections, between electronic components and a circuit board to be tested is characterized in that the test system has a communication interface, which by contacting of the circuit board enables a data exchange with a data memory or a communication module of the circuit board to be tested, wherein the communication interface is arranged within a housing of the test system freely movably in at least two spatial directions, preferably three spatial directions.

Depending on position of the circuit board to be tested, i.e. the test item or the test circuit board, the communication connection can be oriented and either contacted with contacting regions on the circuit board or inserted into a communication connection of a communication module, e.g. an Ethernet socket. The movability of the communication interface enables an optimal positioning and contacting of the test system with the test circuit board.

The data exchange can be utilized for testing the data exchange through the test circuit board. Alternatively or supplementally, also data, e.g. a MAC-address or the like, can be downloaded by the test system to the circuit board.

Other advantageous embodiments of the invention are subject matter of the dependent claims.

The communication interface can have at least three electrically conductive contact tips. A data supply to the circuit board to be tested can occur via at least a first of the three contact tips, and a data return from the circuit board can occur via at least a second of the contact tips. A reference potential can be applied to at least a third of the contact tips.

The contact tips can advantageously be spring biased, in such a manner that in the case of application of terminally located pushing action on the contact tips the contact tips retract partially into the sleeve-shaped housing section. In this way, the danger of mechanical damage of the contacting regions on the circuit board to be tested, with which contacting regions of the contact tips contact and exchange data, is lessened.

Via at least two of the contact tips, advantageously, a differential data supply to the circuit board to be tested can occur and a differential data return from the circuit board can occur via at least two other contact tips.

The communication interface can be connected fixedly or with a cable with the test module, which is arranged movably in at least two spatial directions in the housing of the test module. In a preferred embodiment, the communication interface is arranged with a fixed separation from the test module and connected mechanically in such a manner that the communication interface moves with the test module, to the extent that the test module is moved.

The communication interface can in another preferred variant of the invention be arranged movably in at least one spatial direction, relative to the test module. Thus, it is, for example, possible by means of the test module to enable a nearing of the contact tips to the circuit board to be tested, for example, in the x- and y directions, and by means of the communication interface to make an approach in the z direction. It is also preferably possible to perform a pre-positioning, for example, in the x- and y-directions and, in given cases, also in the z direction, by the test module and to implement a fine adjustment of the position of the test pins in one or more spatial directions by means of the communication interface being displaceable relative to the test module. In this way, only signal lines of lesser length are required between the test module and the communication interface.

The contact tips are preferably and advantageously extendable from and retractable into a housing of the communication interface, especially preferably, they are spring biased. Thus, the number of contact tips can be matched to the array-geometry of the metal contacting regions on the circuit board. Excess contact tips are retracted and do not damage the surface of the circuit board. The movability of the contact tips can be implemented, for example, by spring force magnet systems, electric motors or spring biased mechanical detent systems, ballpoint pen-detent systems, and the like.

The test module can have a data memory and/or a communication chip. The communication chip includes at least one data memory and a processor. Advantageously stored in the data memory and/or the communication chip are a number of communication protocols and a processor or a logic chip selects at least one communication protocol from the number of communication protocols. The aforementioned processor can also be the processor of the communication chip.

Because of the number of communication protocols in the test module of the test system, circuit boards with different communication protocols can be checked, whereby the circuit boards to be checked, i.e. circuit boards to be tested, can be checked independently of the communication protocols provided on the circuit boards.

The test module can have a sensor apparatus, especially a camera or a barcode scanner, for detecting an identifying feature of the circuit board, especially a barcode, a QR-code or serial number. Based on the identifying feature, the test system can learn the communication protocol present on the circuit board and the communication protocol or the number of contacting, extended contact tips can, based on such knowledge, be preselected, and set, based, for example, on the geometry of an array arrangement of metal contacting regions on the circuit board to be tested.

The test system advantageously includes an electrical current- and/or voltage source for energy supply of the circuit board to be tested via the communication interface, wherein the electrical current- and/or voltage source is arranged movably in at least two spatial directions within the housing of the test system. The electrical current- and/or voltage source can also have a control characteristic.

The test system preferably includes one or more pin like test tips, which scan the circuit board on a top of the circuit board to be tested for testing the soldered connections between the circuit board to be tested and the components arranged on the circuit board to be tested and populating it.

The test tips can advantageously have articulations and/or movable axes and be arranged movably, especially capable of traveling, in a number of directions in the housing of the test system.

The test module and the communication interface can be arranged such that they can approach the circuit board to be tested from below the circuit board to be tested.

The test module can have one or more test tips for testing the electrical connection of components of the circuit board, which test tips can be extended in a maximum of one direction from the test module.

The test module can have tool components for handling the circuit board, especially for the removal of mounting aids or for repair of electrical connections. Such tool components can be e.g. soldering tools or plier tools.

The test module and/or the communication interface can especially advantageously have a transformer module, especially an Ethernet-converter, which is connected before the contact tips.

The test module and/or the communication module can have a temperature measuring device for temperature measurement of soldered connections and electronic components. In this way, a time efficient and comprehensive checking of the circuit board occurs. Thus, during the checking of the communication interface, a temperature checking of components on the circuit board to be tested can occur, and, in given cases, also their repair using the aforementioned tools.

The test module can advantageously have a driver and/or sensor, with which the voltage level of the communication protocols can be set and with which also the electrical currents on the communication lines can be measured and monitored.

The test module can, additionally, have a relay matrix and/or a multiplexer, with which can be connected the communication lines, however, also other signal sources, especially signal sources from the test system and/or a computer connected thereto, and/or voltage signals of the electrical current- and/or voltage source and/or ascertained measurement data, especially measurement data of the temperature measurement as well as interface signals of the communication unit on any of the contact tips of the communication interface.

The test module advantageously includes a self diagnosis function, which tests one or more functions, especially the functioning of the relay matrix and/or the multiplexer, the sensor and/or the driver of a second multiplexer, the communication chip, the control unit, as well as the electrical current- and/or voltage source and can report the results to the test system.

The test module can advantageously have a transformer module with a transformer, with which a galvanic isolation of the communication module on the circuit board to be tested is implemented and a matching in the sense of an Ethernet connection is assured, especially independently of whether with the communication module a further electrical connection to an Ethernet socket is present or not.

BRIEF DESCRIPTION OF THE DRAWING

The invention will now be explained in greater detail based on a number of examples of embodiments and with the help of the appended drawing, the figures of which show as follows.

DETAILED DESCRIPTION

Test systems for testing electronic circuit boards are known per se. They serve for testing the operation of individual electronics components, which are arranged on the circuit board and soldered with such. Furthermore, such test systems can serve for testing the electrical connections of the electronic components, and of the electronic components among one another and with the conductive traces of the circuit board.

Figure 1:
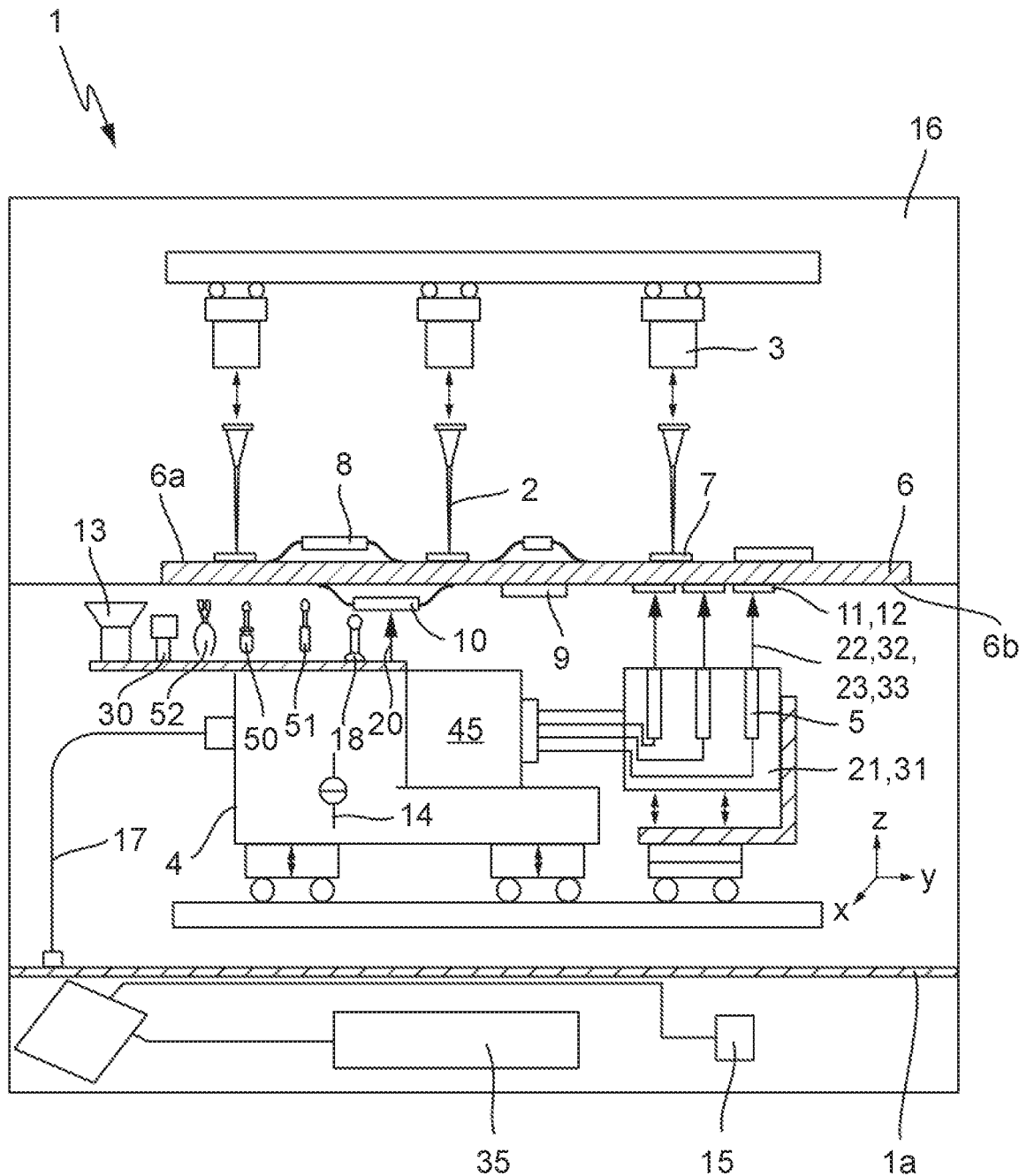
FIG. 1 shows a schematic representation of an axially driven test system of the invention for testing electronic circuit boards.

FIG. 1 shows a test system 1 of the invention for testing electronic circuit boards, wherein a particular circuit board 6 to be tested has a number of integrated circuits 8 on its upper side 6a.

Applied by the test system 1 above the circuit board to be tested is at least one pin like test tip 2. Preferably, a plurality of pin like test tips 2 are used. These tests tips can preferably be embodied as electrodes. Movement of the test tip or test tips to and from the circuit board 6 can occur, for example, using robot arms 3, which are guided above the circuit board 6 to be tested freely in the x-, y- and z-planes, e.g. by movable, telescoping arms or by x-, y- and z-linearly motorized, articulated arms, movably toward- or away from the contact points 7 of the circuit board. At these contacts points 7, resistance values can be ascertained.

The robot arms 3 can, for example, be embodied as a linearly guided carriage, which has one or more joints, so that the pin-shaped test tips 2 are guidable to the circuit board from above or along a plurality of axes.

Arranged beneath the circuit board 6 to be tested is a test module 4, which is part of the test system 1 and is movable toward an underside 6b of the circuit board 6. Test module 4 is, thus, arranged analogously movable in the x-, y- and z directions relative to the circuit board 6. This is enabled e.g. in the x and y directions by linear guiding, e.g. by linearly guided slide tracks, thus e.g. so-called linear tables. This can occur especially by a roller-, chain- or cable pull guiding. Thus x- and y-linear guiding is then movable in the z direction, thus, perpendicularly to the plane of the circuit board 6, by a robot arm or other linear guiding.

Alternatively thereto, also the circuit board 6 can be arranged movably relative to the test module 4 and/or the pin-shaped test tips 2. In such case, the test system 1 includes a holder movable at least in the x- and y directions, in given cases, also in the z direction, e.g. by a height adjustable, linear table.

Test module 4 can, thus, be brought toward the circuit board 6 from below. Differently from the case of the individual test needles guided from above for testing the electrical integration of the electronic components with the circuit board 6, the test module performs a testing of function, e.g. the data transmission of a communication module 9 of the circuit board 6.

Test module 4 includes a communication interface 5, for communication with the communication module 9 of the circuit board 6 to be tested. By means of the communication interface 5, the test system 1 can be used to program a data memory 10 arranged on the circuit board 6 to be tested. The test system can, in this way, furnish data to the data memory, for example, data in the form of a serial number, an IP/MAC-address, as well as comparative values and/or data sets predetermined in the plant. Two preferred variants for the communication interface 5 are shown in FIGS. 4 and 5.

Figure 4:
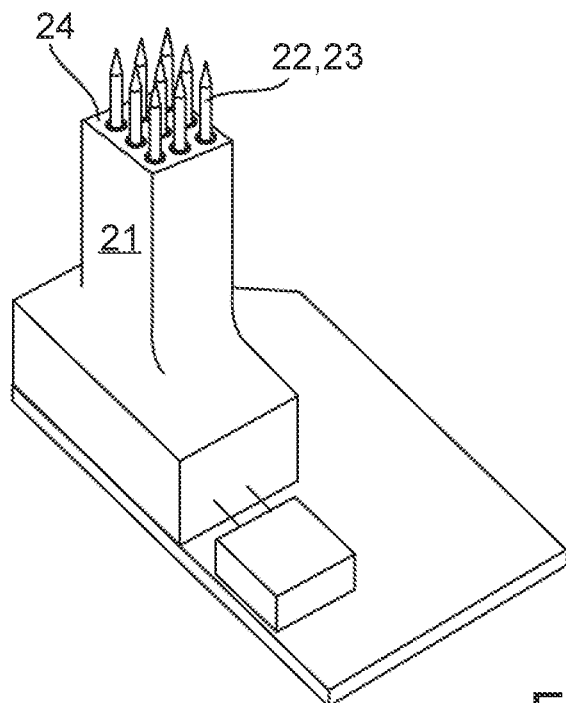
FIG. 4 shows a schematic representation of a first variant of a communication interface as part of the test system of the invention.
Figure 5:
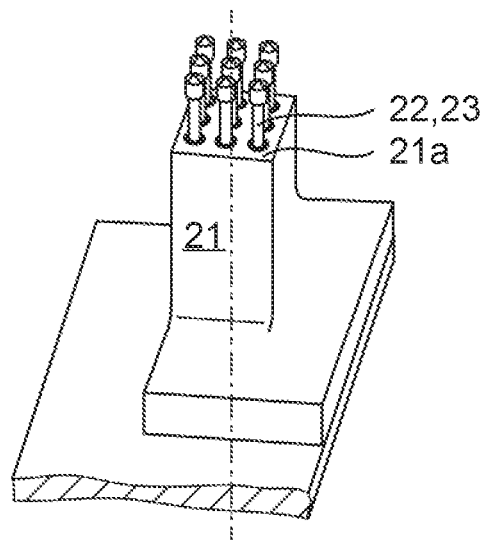
FIG. 5 shows a schematic representation of a second variant of a communication interface as part of the test system of the invention.

Communication interface 5 includes in FIG. 4 preferably a housing section 21 and a number of contact tips 22, which protrude in the form of an array arrangement 23 from an end face 24 of the housing section 21. The contact tips 22 of the array arrangement 23 are arranged in a rectangular arrangement with a total of nine contact tips. The housing section 21 sits on a circuit board, which can be that of the test module 4 or on a circuit board set apart from that of the test module but connected via data links as well as energy supply lines and preferably also via a fixed mechanical connection with that of the test module 4.

In this way, energy supply and data linking of the communication interface in a preferred variant of the invention occurs directly via the test module 4 and the components arranged thereon or connected therewith, so that long data transmission paths are prevented and signal quality in the case of data transmission as well as also transmission speed can be increased.

Array arrangement 23 serves for contacting the communication module 9 on the circuit board to be tested. For this, circuit board 6 includes metal contacting regions 11. The contacting regions 11 are point shaped or rectangular segments, which are spaced from one another and have the same arrangement as the contact tips 22 of the array arrangement 23.

Contact tips 22 are spring biased in the housing section, so that in the case of contacting the contacting regions 11 of the circuit board 6 they can avoid exerting excess pressure by retreating into the housing section 21. Thus, because of the flexibility, i.e. the ability of the contact tips 22 to move in and out of the housing section, bending of the contact tips 22 and damage to the contacting regions 11 of the circuit board 6 can be prevented. Contact tips 22 can be held via at least one securement element in a retracted position, in which a spring, with which a spring biased contact tip 22 interacts, is compressed and clamped. Thus, an option is provided to change the array arrangement, thus, the number of completely extended contact tips, and, thus, to match the number of contacting regions 11 of the circuit board. To the extent that more contact tips 22 than corresponding contacting regions 11 are present, then rigidly-projecting, thus, non-spring biased, contact tips would lie on an unprotected surface of the circuit board, whereby damage could occur, both damage of the contact tips 22 as well as also scratching of the circuit board. This is advantageously prevented by the ability of the individual contact tips 22 to extend or retract from or into the housing section 21.

Figure 2:
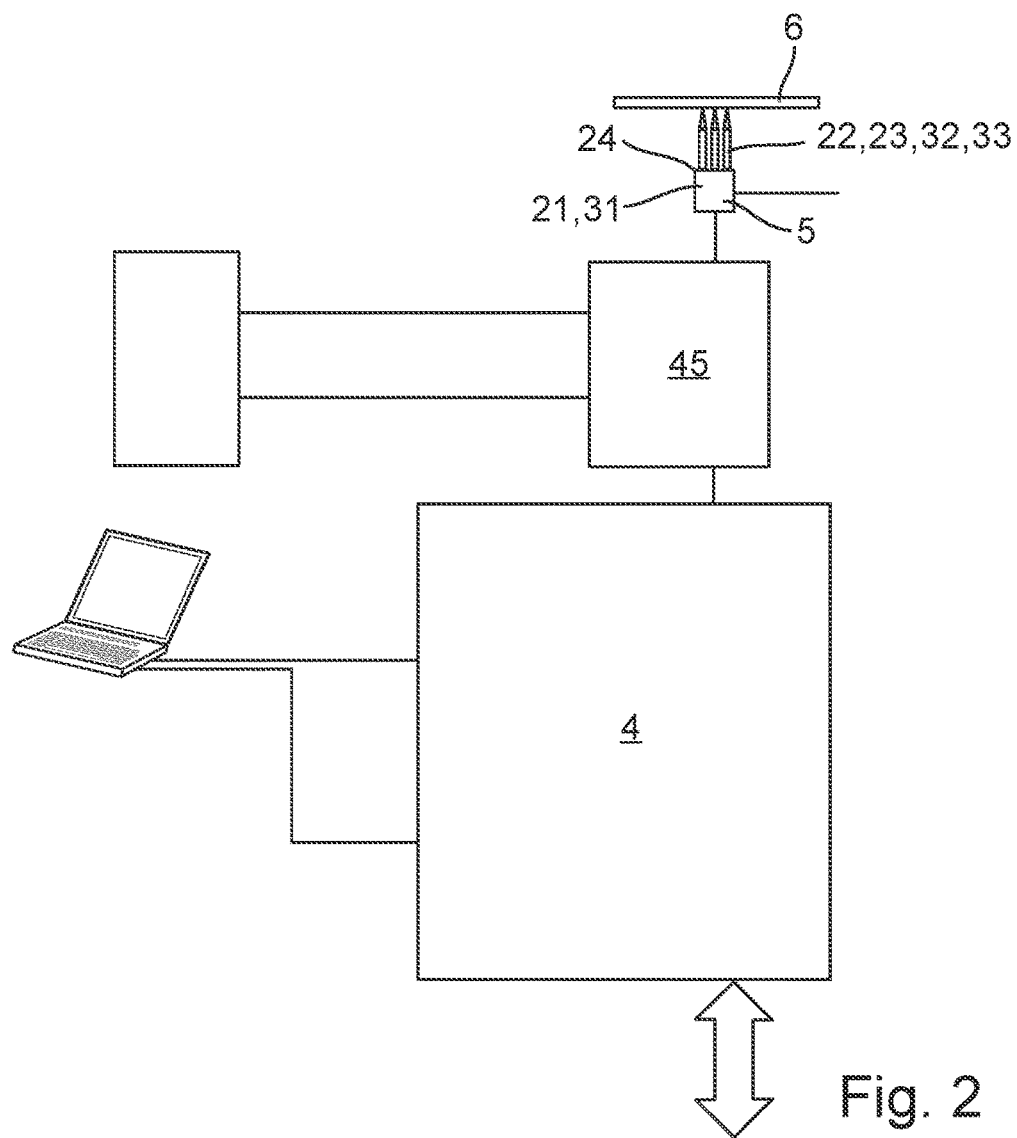
FIG. 2 shows a schematic representation of a test module as part of the test system of the invention.

FIG. 2 shows schematically an aforementioned test module 4 connected with the communication interface 5. This test module 4 is preferably applied for communication by the test system 1, for example, in connection with a computer, for testing circuit board 6. Additionally, it can, however, also serve via the communication module 5 to tap measurement data from the circuit board to be tested and to forward such to the measuring electronics of the test system. This is performed via switching contacts on the test module 4.

These switching contacts enable use of the test module 4 for communication, for forwarding measurement data or for a mixed operation.

Via the transformer module 45, which, among other things, also has switching contacts, yet more data sources can be connected via the communication module 5 directly with the circuit board 6 to be tested. Control signals, which preferably come from the test system 1, control, for example, the switching of relays in the transformer module 45.

Figure 6A:
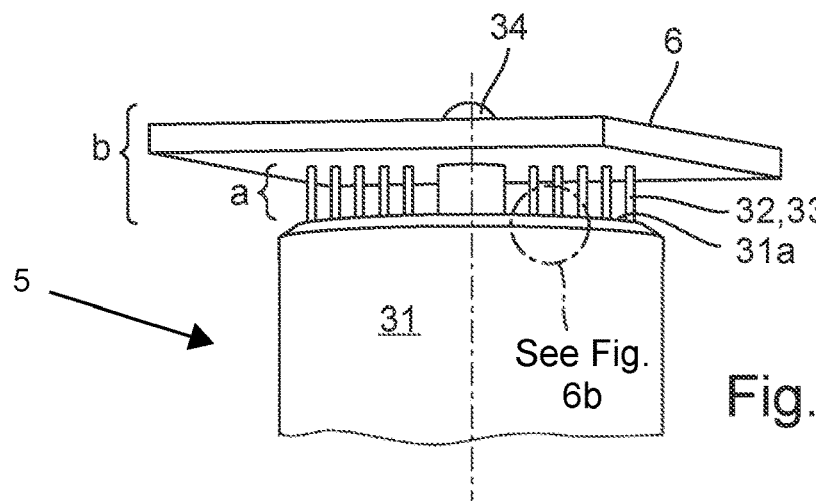
FIG. 6a shows a schematic representation of a contacting arrangement of a circuit board for data exchange with a communication interface of a test system.

Communication interface 5 of FIG. 6a preferably likewise includes a housing section 31 and a number of contact tips 32, which are located in an array arrangement 33. In the center, a plug 34 is arranged, which is spring biased and in the case of contact with the circuit board retracts a predetermined distance into the housing section 31. In this way, damage of the circuit board 6 or damage of the contact tips is prevented in the case of contacting of the array arrangement 33 on the circuit board 6.

An array arrangement 23 or 33 within the scope of the invention is an arrangement of a number of contact tips 22 or 32, which contact a circuit board 6 with fixed and defined separations relative to one another and perform a data exchange at contact points.

In such case, three contact tips are used in the simplest case. This already enables implementation of data transmission using the so-called SPI-bus system (Serial Peripheral Interface). In such case, a first contact tip 22 or 32 is required for data supply, a second contact tip 22 or 32 for data return and a third contact tip 22 or 32 for a reference potential.

By enabling more contact tips, other functionalities can be handled. Thus, another reference potential can be tapped. Also a galvanic isolation can be provided. The circuit board can be powered with one or more voltages. Furthermore, one or more simulations can be performed, e.g. by sending a control command using a contact tip 22 or 32. Also, a measured value testing of a component of the circuit board 6 can be performed from a contact tip 22 or 32 as response to the transmitted control command. Another contact tip 22 or 32 can serve as indication line for testing the operational readiness of the components of the circuit board 6.

With the communication interface 5, contacting with the contacting regions 11 of the circuit board 6 allows testing the Ethernet connection of the circuit board into the communication module for the Ethernet connection.

Especially preferably, the number of contact tips 22 or 32 per array arrangement 23 or 33 amounts to nine or ten.

The above-described variants of a communication interface have the special advantage that they can be positioned directly by the test module 4 and, starting from the test module 4, have short signal- and energy supply lines to the communication interface 5. In this way, data loss from long transfer paths is prevented and also an exact signal production and signal receipt by the communication interface 5 achieved.

The contacting regions 11 represent the counterpart for the array arrangement 22 or 32 of the communication interface 5. The contacting regions 11 can have different forms, e.g. be round or rectangular. They are each an uninterrupted metal surface. A plurality of contacting regions 11, e.g. nine contacting regions 11, form a contacting arrangement 12. The contacting regions of the contacting arrangement 12 are spaced from one another in the form of a pattern. These spacings of a contacting region 11 from each neighboring contacting region are preferably always equally arranged. The contacting regions are free of other components and/or solder resist or other coatings, which could disturb the data connection.

The contacting regions 11 of the contacting arrangement 12 of the circuit board 6 are preferably arranged in a circularly shaped pattern, preferably arranged on at least two or more circular paths or likewise preferably in a rectangular pattern, preferably square, on the circuit board 6.

Figure 7:
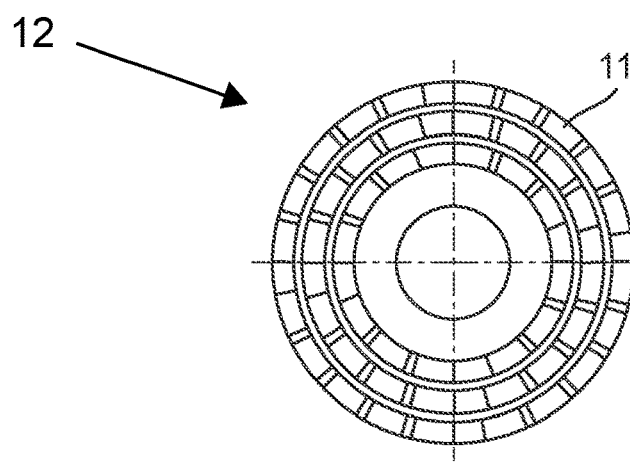
FIG. 7 shows a schematic representation of a second contacting arrangement on a circuit board for data exchange with a communication interface of a test system.
Figure 8A:
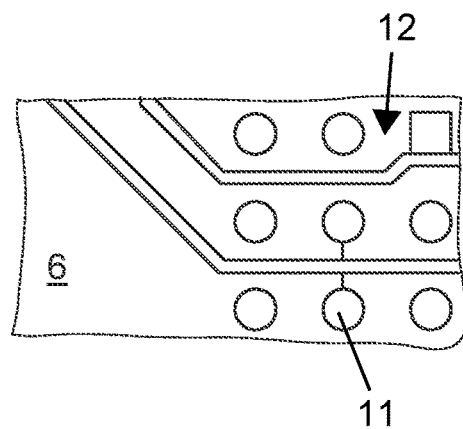
FIG. 8a-8c shows a schematic bottom view of the second variant of a communication interface of the test system of the invention of FIG. 5.
Figure 8B:
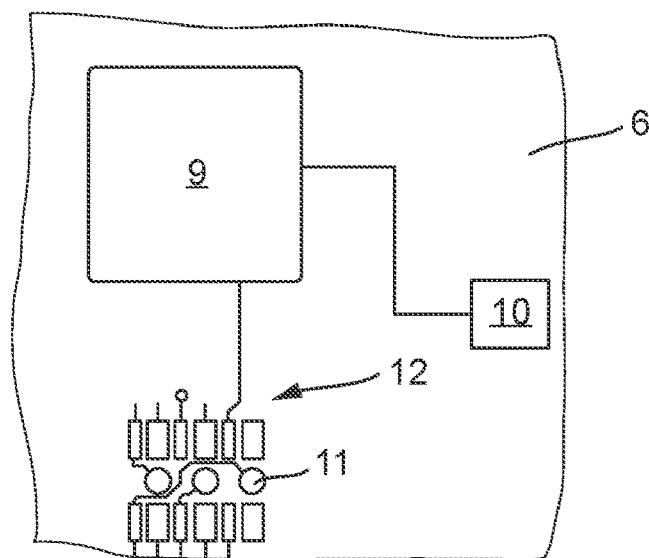

Corresponding patterns are shown in FIGS. 8a and 7.

Figure 6B:
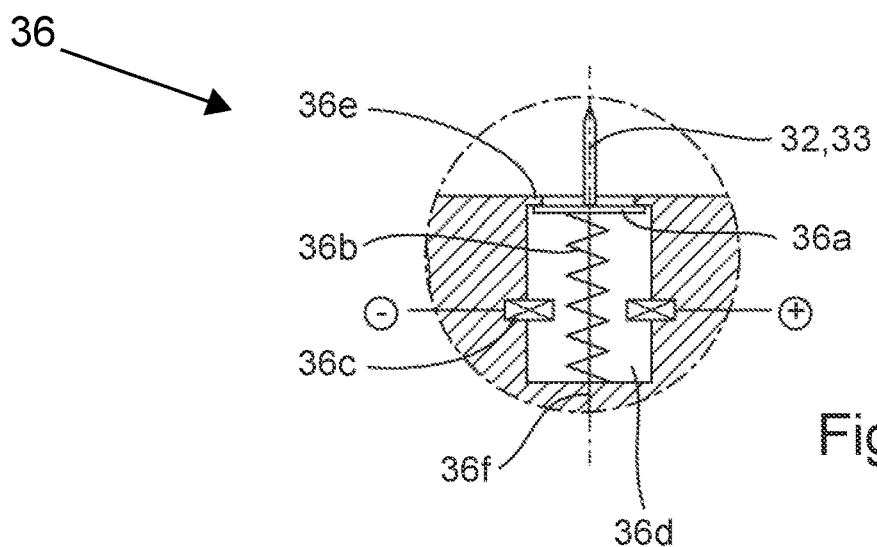
FIG. 6b shows a schematic representation of a holding apparatus for the moving in and out of contact tips of the communication interface.

FIG. 6b represents in detail a holding apparatus 36 of a contact tip. As shown, the contact tips can move in and out of the housing of the communication interface. The holding apparatus shown in FIG. 6b is, in such case, only one of a number of variants for holding a contact tip in a retracted position in the housing. In such case, the contact tip 32 has a plate-shaped formation 36a movably accommodated in a passageway 36d. A spring 36b presses against the formation 36a, whose movement is limited by a stop 36e, which protrudes inwardly into the passageway. For holding the contact tip 32 in a retracted position, an electromagnet 36c is provided, which pulls the disk-shaped formation of the contact tip upon the activating of the electromagnet. To the extent that the electromagnet 36c is not activated, the contact tip is exclusively spring biased. Extending from the contact tip is a cable 36f, which serves for signal- and/or energy transmission. The holding apparatus is not limited to FIG. 6b, but, instead, can also be used for all other variants of the above-described communication interfaces.

The contacting regions 11 are preferably gold coated or tinned, in order to provide a better data link.

A corresponding contacting arrangement 12 is preferably arranged on the communication path in the vicinity of the communication module 9 of the circuit board 6, so that communication with the individual components of the circuit board and a loading of data e.g. into the data memory of the circuit board can occur by detouring around the communication module 9, thus, e.g. the Ethernet socket.

A circuit board 6 to be tested having a communication module, which is embodied as an Ethernet interface, can in the case of a testing in a manner not of the invention, be contacted by any test system via a standard Ethernet socket with a communication interface of the test system.

In the context of the present invention, it is, however, provided that such a testing occurs in an automated manner, wherein plugged connection via an Ethernet standard socket is unnecessarily complicated for such purpose. An automated testing of such an Ethernet interface has not been offered by established companies, which develop automated test systems, e.g. for testing solder contacts.

Communication interface 5 can preferably have one or more components, which emulate the components of the communication module 9 of the circuit board 6. This component is arranged in FIGS. 4, 5 and 6a in the housing section 21 or 31 and can be embodied, for example, as transformer module 45, also called converter. Such a transformer module can preferably be a so-called Ethernet Magnetic Transformer. A corresponding transformer module is most often also integrated in an Ethernet plug, which, however, can be bypassed by contacting of the communication interface 5 with contact areas 11 of a contacting arrangement 12 on the circuit board 6.

Thus, the communication module can be connected with the circuit board 6 and exchange data with the components via the array arrangement 23, 33 without large signal loss before and after the transforming due to long data links.

Because of the functionally equal simulation of the components of the communication module 9 of the circuit board by the components of the communication interface 5 of the test module 4, a secure communication with the processor unit, the data memory and additional components on the circuit board 6 to be tested can be assured, without it depending on whether the bridged over Ethernet socket of the circuit board 6 has no transformer module, a transformer module or a number of transformer modules interconnected with one another in series or In parallel.

After the read-out of the type of Ethernet socket on the circuit board by the test system e.g. based on a barcode on the circuit board, the test system can select a corresponding components circuit, which corresponds to the circuit of the Ethernet socket, so that an equal data exchange is enabled between the test system 1 and the circuit board 6, in spite of the bridging over, thus as if the test system were connected therewith via the Ethernet socket of the circuit board 6.

Thus, for example, a data exchange can occur at a typical data transmission rate of 10 to 100 Mbit/s Shown in FIGS. 6a and 8a is a variant of an array arrangement 33 with a plug 34. In this variant, the plug is embodied as a centering plug and the contact tips 32 are arranged spaced from one another along a line extending radially to this centering plug.

The contact tips 32 can be capable of being moved out, and, for example, based on a locating mechanism, when required, be moved out. Thus, depending on component type of the circuit board, the not-required contact tips 32 can be retracted.

The component type can be identified based on a barcode located on the circuit board. The barcode can be detected by means of a camera 13 located on the test module 4. Depending on the information in the barcode, then the communication interface 5 and associated components, as well as other components of the test module 4 can be correspondingly operated and, especially, placed in readiness.

Because contact tips can be retracted, less space on the circuit board to be tested is required for contact areas 11, so that material of the circuit board can be saved and an optimized component arrangement achieved on the circuit board.

Figure 8C:
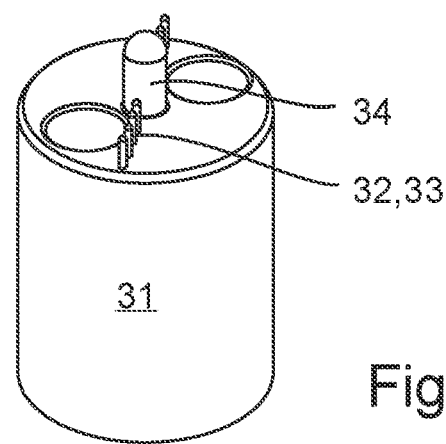

The centering by the centering plug can especially work together with an arrangement of contact areas 11 on a circuit board 6 as shown in FIG. 8c.

Furthermore, it is, in such case, advantageous that the array arrangement, thus, the arrangement of the pin-shaped metal contact tips 22, 32, is arranged rotatably around an axis defined by the centering plug. Then, the pin-shaped contact tips can better approach the contact areas 11 and make contact with them, so that advantageously the number of contact areas 11 can be reduced. The rotatability of the array arrangement is also advantageous in the case of rectangular array arrangements of the contact tips, such as shown e.g. in FIG. 4.

Figure 12:
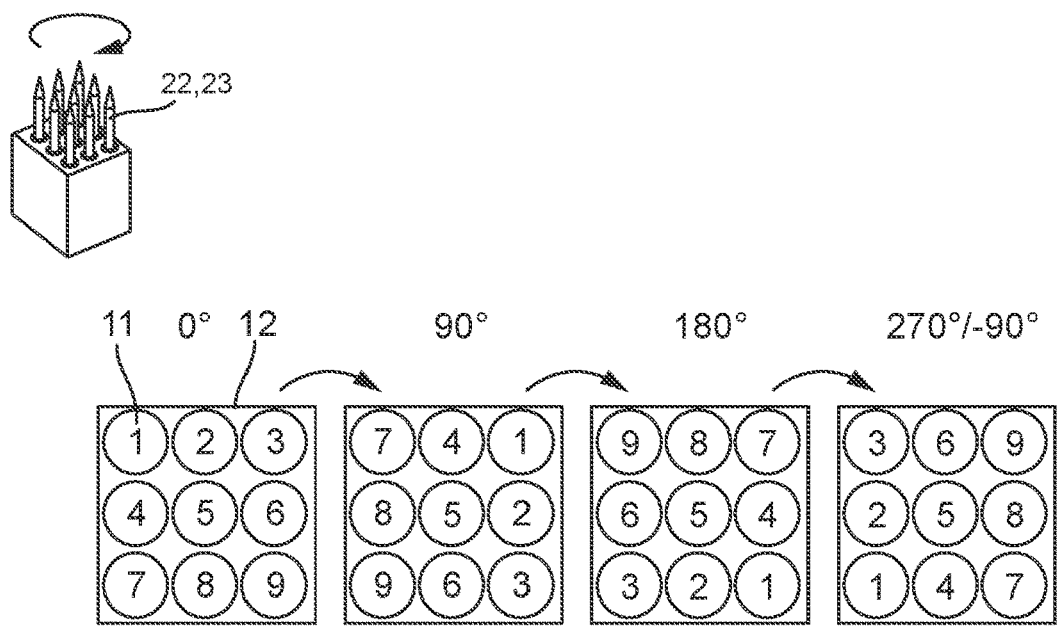
FIG. 12 shows a schematic representation of a rotating communication interface.

The rotatability of the array arrangement 23, 33 as shown in FIG. 12 and FIG. 8c is, additionally, advantageous, since, in this way, circuit boards 6 can be supplied with different orientations, thus, delivery in longitudinal- or transverse direction of the circuit board, and tested in the test system 1, without requiring that the circuit board first must be brought into position by rotation. Rather, by rotation of the array arrangement 23, 33, its tips 22, 32 can be oriented according to the orientation of the circuit board. A twisting of the circuit board or its supply in the test system with a non-optimal orientation is thus of no consequence for the testing and the transferring of data.

The rotation of the array arrangement, e.g. by rotatable seating of the array arrangement, can, thus, both be implemented advantageously in the case of the present invention for a rectangular array arrangement of the contact tips as well as also for a linear arrangement of the contact tips.

Figure 13:
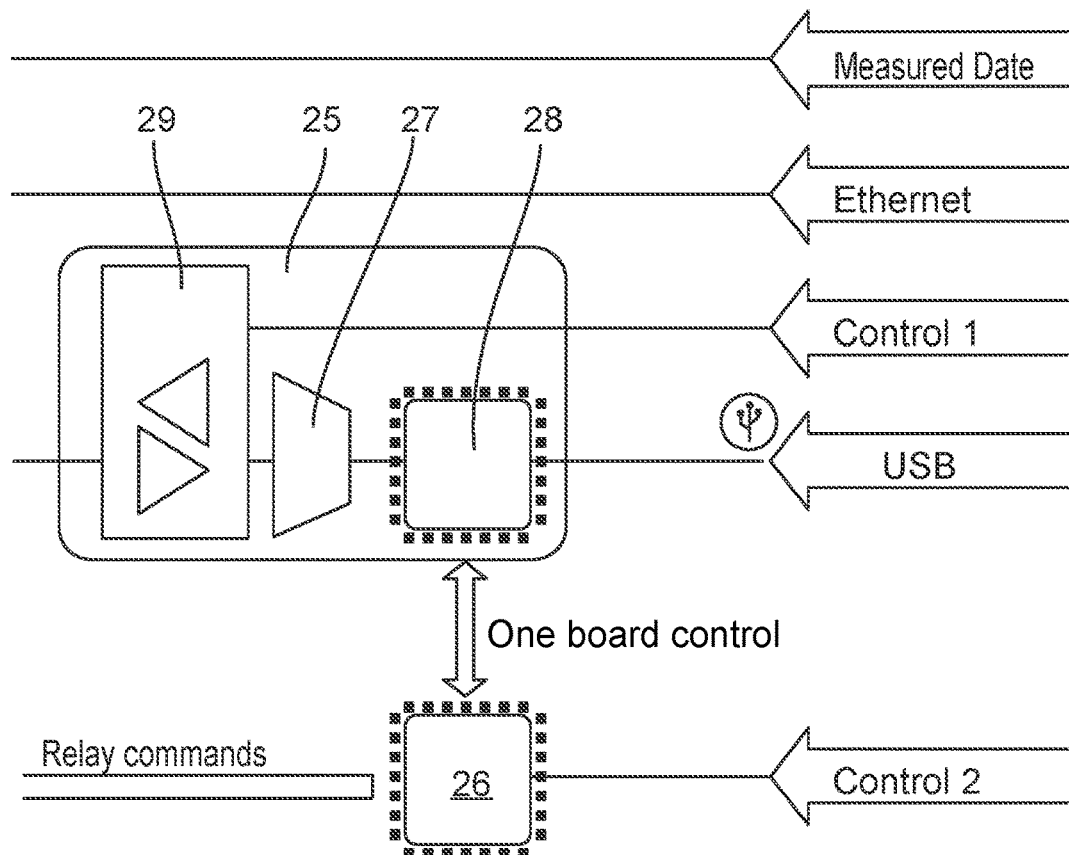
FIG. 13 shows a schematic representation of an implementation with different communication protocols.

By furnishing various data sets, the test module 4 can communicate via different communication protocols with the circuit board 6 to be tested and the thereon located communication modules 9 and data memory 10, such as shown in FIG. 13. Thus, depending on type of communication, an individualized supplying of communication protocols can occur and, in given cases, there can be a switching between types of communication. For this, no additional systems are enabled, but, rather, the data transmission can occur during the testing of the solder locations and electronic components.

In this way, depending on need, different communication protocols can be applied by the test system for the circuit board 6 to be tested and/or the circuit board 6 can be tested for the presence of these communication protocols. Such communication protocols include e.g. I2C, SPI, USB, Ethernet, Profibus and/or UART.

The levels of the drivers are, in such case, preferably settable via software stored in the data memory or a logic chip of the test module 4 or directly via the test system 1. Thus, the test module 4 can communicate via the communication interface 5 not only with different communication protocols but, instead, can also match the voltage level of the communication signals to the level of the circuit board 6 to be tested.

Furthermore, there is stored in the data memory or the logic chip of the test module 4 a self diagnosis program, with which a diagnosis of the test module 4 and the communication interface 5 can occur and which can be executed by a processor or a logic chip of the test module 4.

In the context of the present invention, the communication interface 5 is referred to as a first component for function checking, with which by sending and receiving of communication data to and from the circuit board 6, the correct data transmission of the circuit board 6 is tested by the test system 1; especially, associated with the circuit board 6, a processor unit, which manages a data memory, is tested by the test system 1. Other components, which preferably can be applied in the case of the present invention, will now be described in the following.

Test module 4 includes at least one or more extra components in the context of the present invention, an example being support element 18 serving for locating items between the circuit board 6 and the test module 4 and, in given cases, for supporting the circuit board 6 against sagging.

A third component, which can be arranged on the test module 4, is a camera 13 for image capture in the visible spectral range. Camera 13 can fulfill different functions.

It can serve for determining the position of the circuit board 6 to be tested.

It can alternatively or supplementally also examine the circuit board 6 to be tested for the presence of components, which should be on the circuit board.

Camera 13 can, also, alternatively or supplementally, register a barcode or a serial number of the circuit board 6, such that the circuit board data-sets and control-programs determined based on this barcode are retrieved from a data memory and initiated. These can include, among other things, particular specifications for examining the circuit board 6, and components arranged thereon, or the scope of the data, which should be transmitted to the data memory of the circuit board 6 with the help of the communication interface.

Camera 13 can, additionally, check for the presence of solder locations.

Other functions, for example, other diagnostic functions, can also be executed by the camera.

A fourth component of the test module 4 can comprise, for example, a metal, pin-shaped test tip 20 e.g. for testing by resistance measurement the solder contacts arranged underneath. In contrast with the test tips 2, which approach the circuit board 6 from above, test tip 20 can be arranged on the test module 4 rigidly with the test module 4 or only movable in one direction, especially outwardly movable. In this way, the mechanical complexity of the metal test tip 20 is lessened.

Alternatively or supplementally to mechanical functions or diagnostic functions by the aforementioned component or the aforementioned components, also exclusively a loading of data e.g. communication protocols can occur through the communication interface 5. Because the loading of the data into the data memory 10 of the circuit board 6 to be tested occurs simultaneously with the testing of the soldered connections e.g. by the test tips 2, a time saving is achieved during the quality checking.

The loading of the data can occur, for example, as a type of basic programming. The circuit board 6 to be tested can especially be applied in a measuring device of automation technology. Data can be transmitted to the data memory 10 as a function of the particular measuring device, the field of application of the measuring device and the production path for manufacturing of the measuring device. The data transmission can occur specifically for the components of the circuit board, so that data for control, testing and/or identification of the individual components or assemblies of the circuit board 6 can be downloaded from the data memory of the test module 4 via the communication interface 5 and the communication module 9 to the data memory 10 of the circuit board.

Alternatively or supplementally to the aforementioned components, the test module 4 can also comprise one or more tool components 50, for example, a soldering element 51 for forming a soldered connection or a pliers 52. Other tool components e.g. a screw driver and the like can likewise be provided. Through use of the tools, a simple repair of the circuit board 6 to be tested can be made soon after detection of a defect by the upper test tips 2 or populating aids can be removed.

Additionally, the test module 4 can also have an electrical current- and/or voltage source for power supply of the tool components or the components for function checking.

Test system 1 includes a data memory 35 having a corresponding test program stored therein. This test program controls use of the support element 18, the contact tips 22, the test tip 20, and/or, in given cases, further tools 50, 51, 52 and their positioning. In this way, different circuit boards to be tested 6 with different separations of the components can be tested and supplied with data.

In addition to the solder location testing performed on the top by the test tips 2, in a variant of the present invention, the test module 4 performs a functional testing of individual components.

The aforementioned test components can be arranged individually or especially preferably together on the test module 4. The latter is advantageous, since then a fixed separation is maintained.

Because of the movability of the test module 4 below the circuit board 6 in the x-, y- and z directions, simultaneously with quality checking of the connections of the electronic components with the lines of the circuit board, also a function checking of the various components of the circuit board to be tested can occur, which means a time saving and also a spatial savings, since no additional test system is needed.

A further aspect of the present invention is the voltage- and/or electrical current supply of the test module 4 and the components connected therewith, thus, the communication interface 5, as well as the circuit board 6 to be tested, however, also other components, e.g. tool components, such as pliers or solder elements or one or more cameras. In the case of previous test systems, the power supply occurs from an electrical current- and/or voltage source away from the test system, thus, spatially removed from the test specimen, and the circuit board 6 to be tested.

According to the invention, the electrical current- and/or voltage source 14 is part of the test system 1 and especially a component of the test module 4. In this way, a voltage drop because of long lines 17 is prevented. The electrical current- and/or voltage source can be controlled by a control unit 15 according to a program or by manual input.

Test system 1 is bounded by a housing 16. While the test module 4, as well as the communication interface 5 and the electrical current- and/or voltage source 14 are movably arranged in the housing, the control unit 15 is preferably fixedly arranged in the or on the housing 16 of the test system 1 or outside of the housing 16.

In a special embodiment of the invention, the contact tips 22, 32 are directly connected with the electrical current- and/or voltage source 14 via an electrical current supply line. The electrical current- and/or voltage source 14 can be supplied from the outside, thus, outside of the housing 16 of the test system 1, with energy, and, likewise with control commands from the outside, be set to a voltage delivery value.

Using the control unit 15, both the voltage supplied to the test module 4 and especially to the communication interface 5 and the electrical current level supplied to the test module 4 and especially to the communication interface 5 can be set or both the supplied electrical current level as well as also the supplied voltage can be set. Thus, especially the contact tips 22, 32 can be operated with an electrical current having a predetermined voltage and/or a predetermined electrical current level.

Electrical current- and/or voltage source 14 in the case of the present invention is a component, which generates from a larger voltage or a larger electrical current level, independently of the size of the supplied voltage or electrical current level, a discrete lower voltage- and/or electrical current level value.

For checking the voltage value, which does arrive at the contact tips 22 or 32, the electrical current- and/or voltage source 14 can preferably be connected with the contact tips via a read back line, a so-called sense line. In the case of the present electrical current- and/or voltage source 15, the output voltage or a part thereof is compared with a reference voltage and so adjusted that even in the case of fluctuating load the output voltage to the circuit board 6 to be tested remains constant. This state is, however, most often present only in the ideal case. Therefore, the voltage to be compared with the reference voltage is ascertained by means of the read back line in the vicinity of the load, thus, at the contact tips 22 or 32, thus, at the end of the supply lines with the fluctuating voltage drop. The voltage drop on the supply lines is, in this way, controlled out and the voltage on the load, thus, at the contact tips of the communication interface 5, remains constant also in the real case. The aforementioned line for each contact tip can be connected in parallel with the voltage input of the test tip, so that the electrical current- and/or voltage source 14 can cancel the voltage drop of the line resistance. The voltage produced by the electrical current- and/or voltage source 14 can, thus, after reconciliation with the readback values, be brought to the desired value. In this way, the voltage drop through the line path between the contact tips 22, 32 and the electrical current- and/or voltage source 14 can be canceled and, in given cases, also voltage fluctuations can be canceled.

On the whole, the power supply from the electrical current- and/or voltage source can be controlled by a program, which preferably is stored in the data memory of the test module 4. A preferred type of programmable voltage source is also known as an LDO (low-drop-out voltage regulator) and can be applied in the case of the present invention as a preferred form of an electrical current- and/or voltage source 14.

The electrical current- and/or voltage source 14 is so designed that it can react and adjust extremely rapidly to load changes on the circuit board to be tested, preferably within some nano seconds. This is preferably required, when in the case of the circuit board 6 to be tested of concern is a component with fast microprocessors with fast communication and memory chips, which exhibit these dynamic load changes. This function is preferably implemented with chips with fast control properties and/or with capacitors, which can bridge over very short energy peaks.

The electrical current magnitude values can in an additional preferred variant of the invention likewise be read-out and limited by reconciliation with a stored data set. This data set can likewise preferably be stored in the data memory of the test module 4 and/or of the control unit 15.

Figure 10:
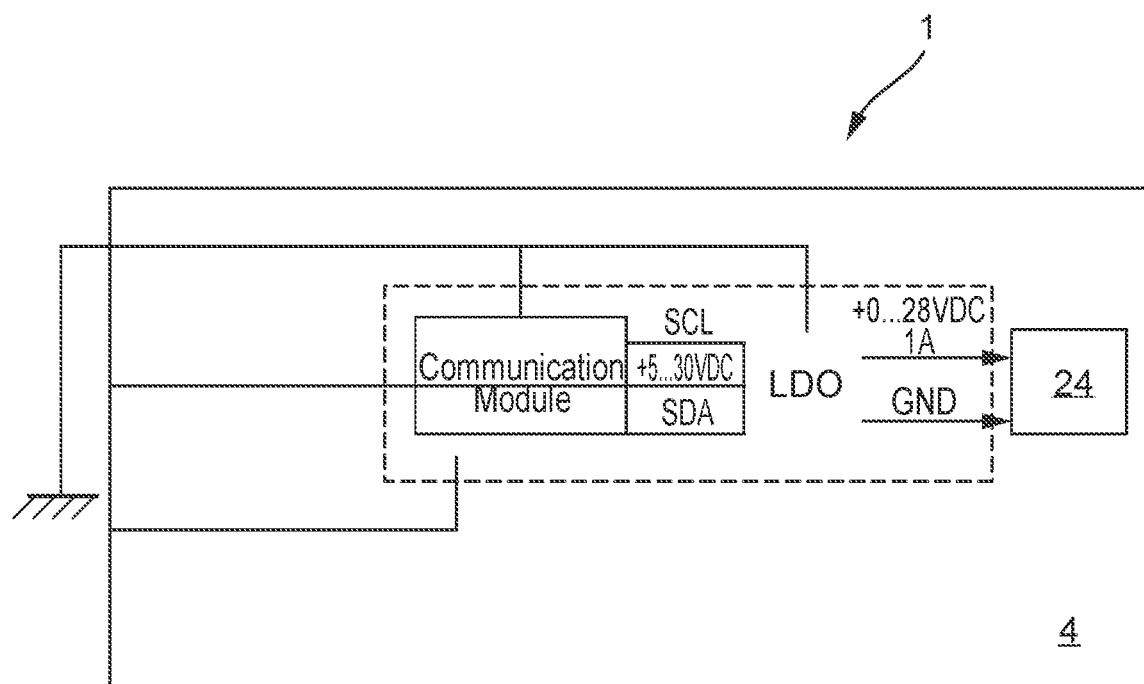
FIG. 10 shows a schematic representation of a circuit diagram of an LDO voltage source with the test module.
Figure 11:
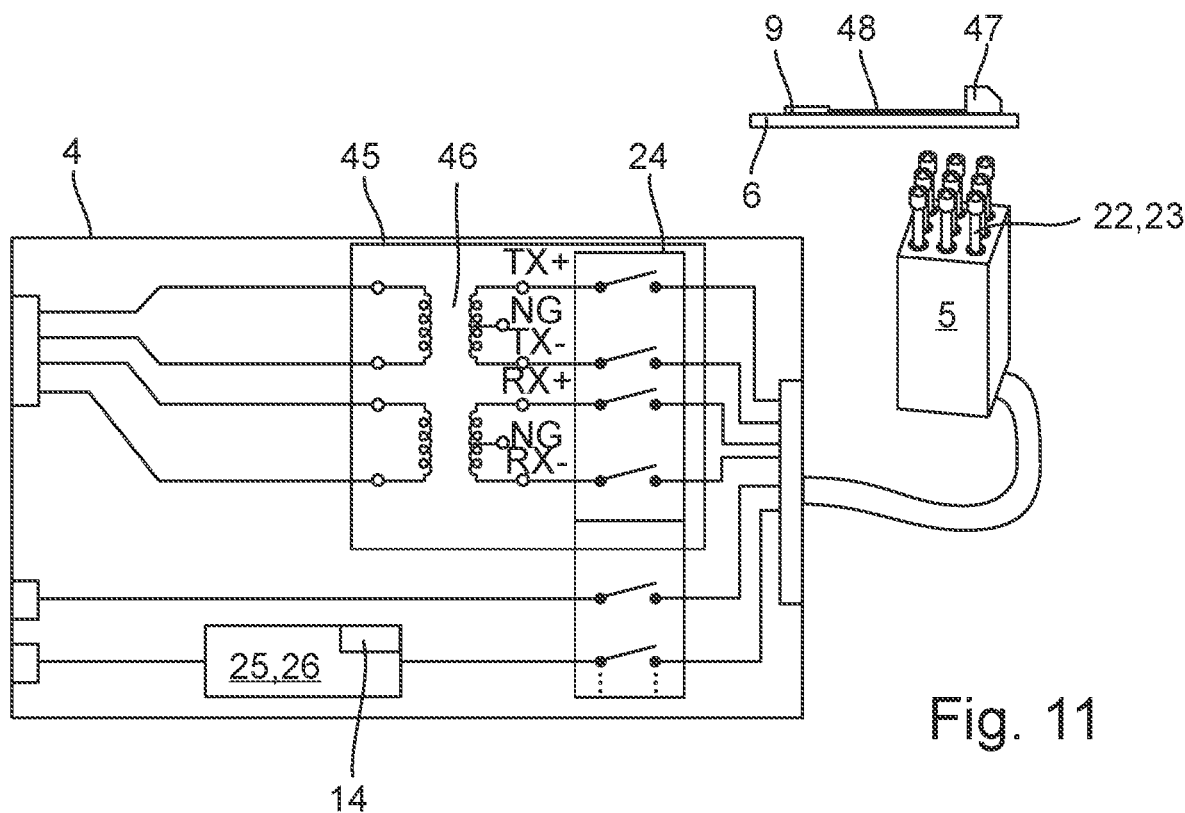
FIG. 11 shows a schematic representation of a transformer module for an Ethernet communication.

A circuit diagram for a preferably applied electrical current- and/or voltage source 14 is shown in the circuit diagram of FIG. 10, whose parts are discussed as follows: The LDO shown in FIG. 10 is a so-called low drop out voltage regulator. The Communication Module is a communication module, which controls the LDO and represents the connection to the test system 1. The LDO can be located in the test module 4 or in the communication interface 5. FIG. 10 shows it in the test module 4.

Figure 9:
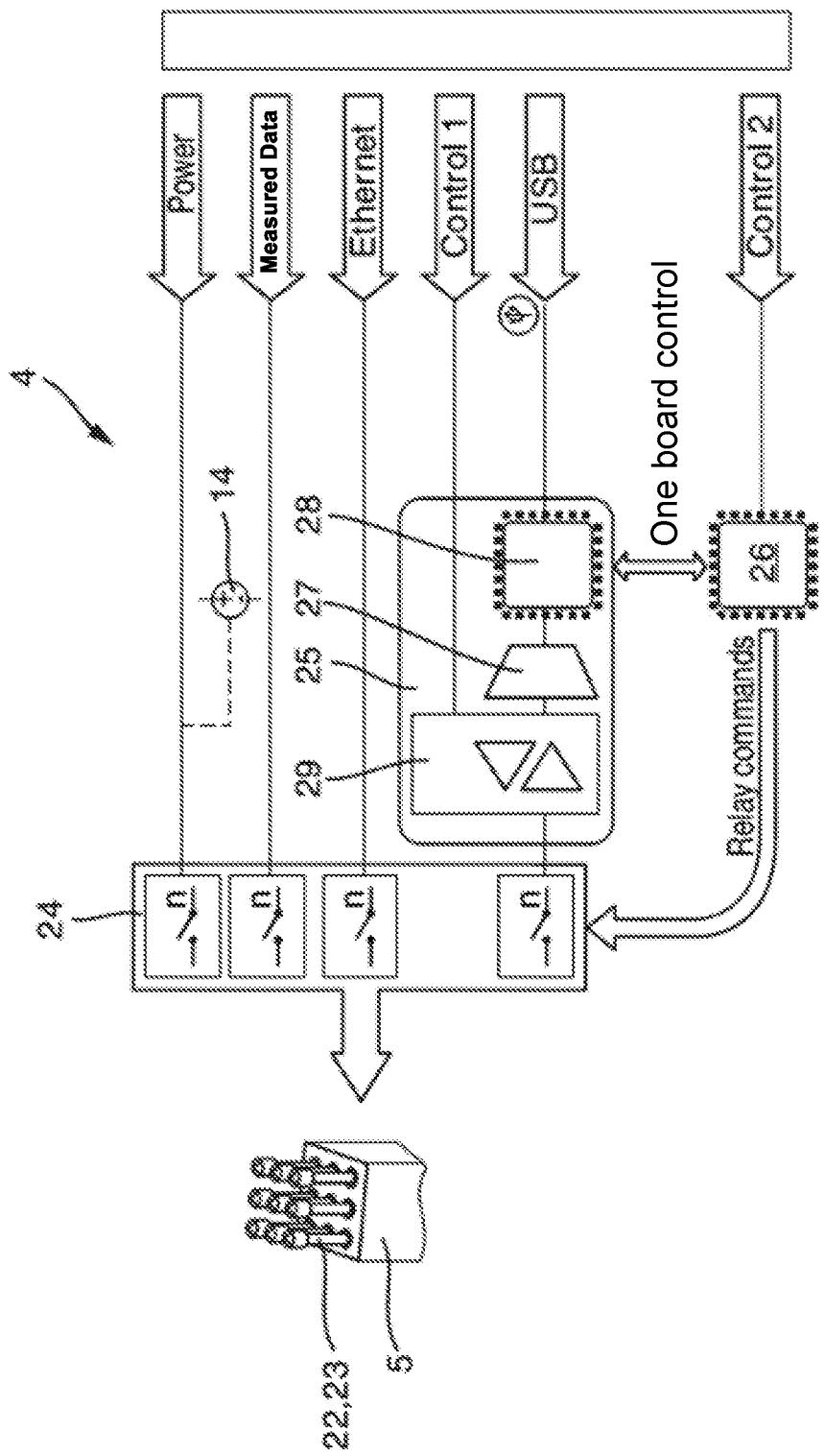
FIG. 9 shows a circuit diagram of an arrangement of a number of components of a test module with a communication interface of the test system of the invention.

FIG. 9 shows the essential components of the communication module. The core is formed by the communication unit 25. It provides the different communication protocols and/or converts a protocol e.g. USB coming from the test system into another protocol. A multiplexer 27 (MUX), which is connected after the communication chip 28, can switch the individual communication signals to any contact tip 2, 32 of the communication interface 5. That, in turn, brings flexibility in the case of the formation of the contact points 7, and the array arrangement 23, on the circuit board 6 to be tested. Connected after the multiplexer 27 (MUX) can be a driver/sensor 29, which can adjust the signal level of the communication signals. Thus, the flexibility of the communication unit 25 is increased, since matching to different signal levels and, thus, to different voltage technologies of the circuit board 6 to be tested is provided. Furthermore, the driver/sensor 29 can also contain a sensor, which measures the electrical current flowing through the communication lines and in the case of deviations e.g. triggers an error report or performs a shutdown. Control of the communication chip 28, the multiplexer 27, the driver/sensor 29 and the downstream relay matrix 24 is done by a logic chip 26, which, in turn, is connected with the test system. Logic chip 26 can be implemented by an FPGA, a microcomputer or other chip with logic functions. An expanded relay matrix 24 increases the flexibility of the test module 4 by allowing switching of a number of signal sources, voltage supplies, communication interfaces, and measurement data as well as the interface signals from the communication unit 25 to any of the contact tips 2, 32 of the communication interface 5. This is true for the electrical current/voltage source 14 of the test module 4 and also for power supply units of the test system 1 connected with the test module 4. In such case, also a mixed or combinatorial switching is an option. The relay matrix 24 can likewise be operated by the control unit 26.

The transformer module 45 is preferably a component of the test module 4 and can be connected via the communication interface 5 with a circuit board 6 to be tested. The circuit board to be tested contains a communication module 9, which preferably supports Ethernet or Profinet communication. Magnetics 46, thus, the transformer, of the transformer module 45 is dimensioned in such a manner that it implements a galvanic isolation for communication module 9 and an electrical fitting in the sense of an Ethernet connection. Additionally, the magnetics 46 of the transformer module 45 is so designed that an Ethernet/Profinet communication with 100 Mbit/s is possible independently of whether with the communication module 9 via an electrical connection 48 a so-called Ethernet socket 47 is mounted or not. It is likewise insignificant whether an Ethernet socket 47 mounted on the circuit board 6 to be tested contains constructionally related magnetics or not.

In addition to the above-described components, the test module 4 can also have a thermography system, preferably in the form of an infrared camera 130, or a temperature sensor, preferably a contactlessly measuring temperature sensor. The variant of the temperature sensor is, however, less preferable, because of the smaller registration range of the temperature measurement. The infrared camera, in contrast, permits a temperature measurement of individual components of a circuit board 6 to be tested and their connection with the circuit board 6. The temperature measurement of the IR camera can occur by freely positioning the test module 4 with the IR camera 30 along the surface of the circuit board 6 to be tested at certain preferred locations. The temperature measurement can preferably occur contactlessly. Alternatively or supplementally to the temperature measurement through the infrared camera, also a test tip having a temperature sensor can perform a temperature measurement provided by contacting the circuit board. This variant requires, however, a greater constructive and mechanical control effort connected with a time-consuming measuring in comparison with the IR camera.

Figure 3:
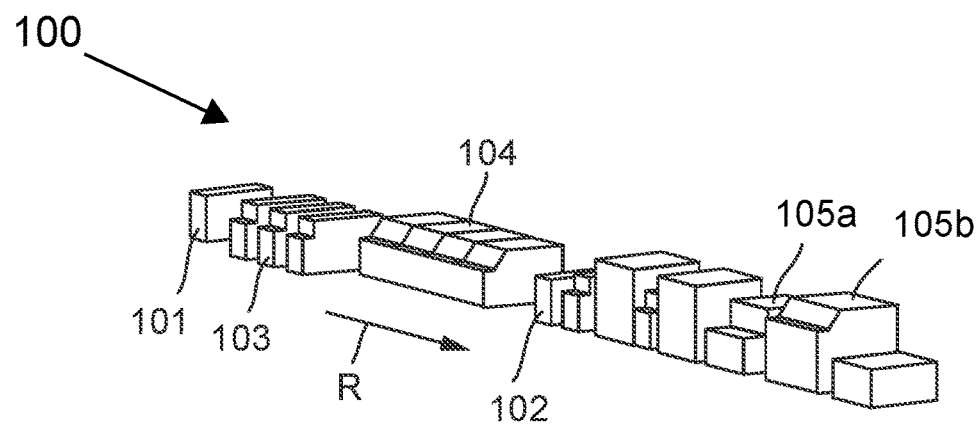
FIG. 3 shows a schematic representation of a production path for manufacturing a circuit board with a test system 1 of the invention integrated in the production path.

FIG. 3 shows a production path 100 for manufacture and testing of circuit boards 6 of the invention, which can be used preferably in measuring devices of automation technology, e.g. in measuring transducers.

Production path 100 includes a station 101 for providing a circuit board foundation. The circuit board foundation can already have conductive traces.

The production path 100 includes a transport apparatus 102, for example, a conveyor belt, with which the circuit board foundation is transported further in a transport direction R from station to station.

Starting from the station 101, in which the providing of the circuit board foundation occurs, such is transported further to a station 103 for populating the circuit board foundation with electronics components, wherein at least one of these components is an intelligent component, which is embodied, for example, as communication module 9 for communication with other electronics devices located away from the circuit board. A further intelligent component is a central processor unit, which is part of the circuit board 6 to be tested and which manages the data of the data memory 10. In this way, the circuit board 6 is formed from the circuit board foundation. The populating can occur e.g. with the assistance of masks previously applied on the circuit board foundation.

Following the station 103 for populating the circuit board, the circuit board 6 is transported into a soldering oven 104, where a soldering of the electronics components with the circuit board foundation occurs.

After passing through the soldering oven 104, a final check of the readied circuit board 6 by the test system 105a and 105b occurs. In such case, the test system 105a simultaneously a) checks the electrical connection of the solder locations between the components and the circuit board, and b) performs a functional testing of one or more of the intelligent components, thus, e.g. the communication module 9.

The aforementioned functional testing preferably includes a function checking of the communication module 9, a programming and/or a testing of the programming of the data memory 10 of the circuit board 6, and a checking of the data link starting from the communication module to the central processor unit of the circuit board 6.

The complex testing of data in the data memory, the processor unit and the communication module cannot occur through individual test tips applied from the top of the circuit board. For this, the above-described communication interface 5 is needed preferably with the above-described embodiments of the respective array arrangements 23 or 33 of a number of contact tips 22 or 32.

The invention claimed is:

1. A test system for testing electrical connections between electronic components and a circuit board to be tested, the test system comprising:
 a housing;
 a communication interface, which by contacting the circuit board to be tested enables a data exchange with a data memory and/or a communication module of the circuit board to be tested, wherein the communication interface is arranged within the housing of the test system movably in at least two spatial directions, and
 a test module that is arranged movably in at least two spatial directions in the housing of the test system,
 wherein the test module includes a data memory and/or a communication chip in which a plurality of communication protocols are stored, and wherein the test module further includes a processor or a logic chip for selecting at least one communication protocol from the plurality of communication protocols,
 wherein the communication interface is connected tightly or with a cable to the test module.

2. The test system as claimed in claim 1, wherein the communication interface includes at least three electrically conductive contact tips.

3. The test system as claimed in claim 2, wherein a data supply to the circuit board to be tested occurs via at least a first contact tip of the at least three contact tips and a data return from the circuit board occurs via at least a second contact tip of the at least three contact tips.

4. The test system as claimed in claim 3, wherein a reference potential is applied to at least a third contact tip of the at least three contact tips.

5. The test system as claimed in claim 2, wherein the communication interface further includes a housing section, wherein the at least three contact tips are disposed at least partially in the housing section, and wherein the at least three contact tips are spring biased such that a pushing action on the at least three contact tips causes the at least three contact tips to retract partially into the housing section.

6. The test system as claimed in claim 1,
 wherein the communication interface includes at least four electrically conductive contact tips, and
 wherein a differential data supply to the circuit board to be tested occurs via at least two of the at least four contact tips and a differential data return from the circuit board occurs via at least two other of the at least four contact tips.

7. The test system as claimed in claim 1, wherein the communication interface is arranged movably in a spatial direction relative to the test module.

8. The test system as claimed in claim 1, wherein the test module includes a camera or a barcode scanner for detecting an identifying feature of the circuit board, including a barcode, a QR-code, or a serial number.

9. The test system as claimed in claim 1, further comprising:
 an electrical current and/or voltage source for energy supply of the circuit board to be tested via the communication interface, wherein the electrical current and/or voltage source is arranged movably in at least two spatial directions within the housing of the test system.

10. The test system as claimed in claim 1, further comprising:
 one or more pin-like test tips embodied to scan the circuit board on a top of the circuit board for testing soldered connections between the circuit board and the electronic components.

11. The test system as claimed in claim 10, wherein the one or more test tips have articulations and/or movable axes and are arranged movably and enabled to travel in three directions in the housing of the test system.

12. The test system as claimed in claim 1, wherein the test module and the communication interface are arranged such that they can approach the circuit board from below the circuit board.

13. The test system as claimed in claim 1, wherein the test module includes one or more test tips for testing electrical connection of components of the circuit board, which test tips are extendable in a maximum of one direction from the test module.

14. The test system as claimed in claim 1, wherein the test module includes tool components for handling the circuit board, including the removal of mounting aids or the repair of electrical connections.

15. The test system as claimed in claim 1, wherein the test module and/or the communication interface include a transformer module connected before the at least three contact tips.

16. The test system as claimed in claim 1, wherein the test module and/or the communication module include a temperature measuring device for temperature measurement of soldered connections and electronic components.

17. The test system as claimed in claim 1, wherein the test module includes a driver and/or sensor with which the voltage level of the communication protocols can be set and with which also electrical currents and/or voltages on/in communication lines can be measured and monitored.

18. The test system as claimed in claim 1, wherein the test module further includes a relay matrix and/or a multiplexer with which can be connected communication lines from the communication chip; signal sources from the test system and/or a computer connected thereto; voltage signals of the electrical current and/or voltage source; ascertained measurement data, and interface signals of a communication unit on any of the contact tips of the communication interface.

19. The test system as claimed in claim 1, wherein the test module includes a transformer module with a transformer with which a galvanic isolation of the communication module on the circuit board to be tested is implemented and a matching in the sense of an Ethernet connection is assured, independently of whether with the communication module a further electrical connection to an Ethernet socket is present or not.

* * * * *